US010056528B1

(12) United States Patent
Qian et al.

(10) Patent No.: US 10,056,528 B1
(45) Date of Patent: Aug. 21, 2018

(54) INTERPOSER STRUCTURES, SEMICONDUCTOR ASSEMBLY AND METHODS FOR FORMING INTERPOSER STRUCTURES (71) Applicant: Intel Corporation, Santa Clara, CA (US)

(72) Inventors: Zhiguo Qian, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/475,219

(22) Filed: Mar. 31, 2017

(51) Int. Cl.
*H01L 21/44* (2006.01)
*H01L 23/04* (2006.01)
*H01L 33/38* (2010.01)
*H01L 23/498* (2006.01)
*H01L 25/07* (2006.01)
*H01L 23/538* (2006.01)
*H01L 21/48* (2006.01)

(52) U.S. Cl.
CPC .......... *H01L 33/382* (2013.01); *H01L 21/486* (2013.01); *H01L 23/49827* (2013.01); *H01L 23/5384* (2013.01); *H01L 25/073* (2013.01)

(58) Field of Classification Search
CPC .................. H01L 33/382; H01L 23/49827
USPC .................. 438/667; 257/698, 621
See application file for complete search history.

(56) References Cited

U.S. PATENT DOCUMENTS

| 7,344,917 | B2 * | 3/2008 | Gautham | H01L 21/486 |
| | | | | 257/E23.061 |
| 8,012,796 | B2 * | 9/2011 | Andry | H01L 21/6835 |
| | | | | 257/698 |
| 9,053,954 | B2 * | 6/2015 | Yasumura | H01L 24/05 |
| | | | | 438/667 |

* cited by examiner

*Primary Examiner* — Calvin Lee
(74) *Attorney, Agent, or Firm* — 2SPL Patentanwälte PartG mbB; Mani Arabi (57) ABSTRACT

An interposer structure includes a plurality of front side contact interface structures for connecting the interposer structure to at least one other structure. Additionally, the interposer structure includes a plurality of back side contact interface structures for connecting the interposer structure to at least one other structure. Further, the interposer structure includes a first through substrate via and an electrically conductive shielding structure. The electrically conductive shielding structure ends before reaching a back side of the interposer substrate die and the first through substrate via is connected to the electrically conductive shielding structure at a front side of the interposer substrate die.

23 Claims, 5 Drawing Sheets

INTERPOSER STRUCTURES, SEMICONDUCTOR ASSEMBLY AND METHODS FOR FORMING INTERPOSER STRUCTURES

FIELD

Examples relate to concepts for interconnecting integrated circuits and in particular to interposer structures, semiconductor devices and methods for forming interposer structures.

BACKGROUND

The electrical connection between different electrical components can be implemented in various ways. For example, System in Package (SiP) integration is a trend in the semiconductor packaging industry to reduce the system form factor, costs and increase performance. Many semiconductor components have a large number of input and/or output interfaces (e.g. pads or bumps) at low pitch to be connected to other components. The routing of the interconnections between electrical components may have a high influence on the cross talk. It may be desired to reduce the cross talk between interconnections.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Electrical components or devices are embedded in packages to provide protection against impact and corrosion, to hold the contact pins or leads and/or to dissipate heat produced by the device, for example. For example, a semiconductor package may contain one or more semiconductor components. Individual components may be formed in a silicon wafer before being cut and assembled in a package. A semiconductor package may have only few leads or contacts for devices such as diodes, or may have hundreds of contact interfaces (e.g. pads, solder balls or solder bumps) in case of a microprocessor, for example. In addition to providing connections to the semiconductor die and handling waste heat, the semiconductor package can protect the semiconductor die against the ingress of moisture, for example. Similarly, non-semiconductor electrical components (e.g. resistors, capacitors, inductors) may be arranged in packages.

Figure 1:
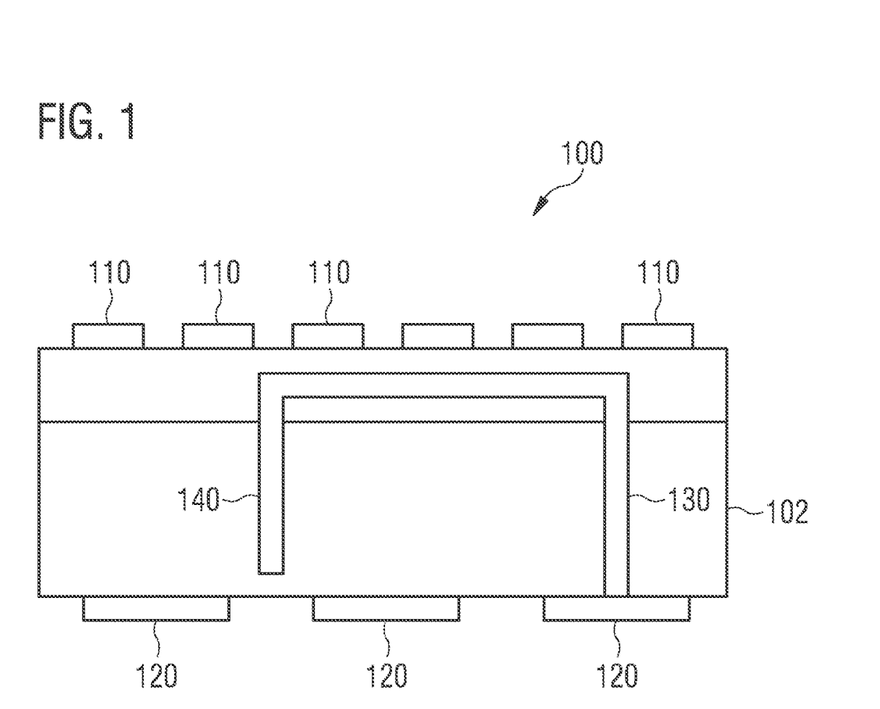
FIG. 1 shows a schematic cross section of an interposer structure.

FIG. 1 shows a schematic cross section of an interposer structure 100 according to an example. The interposer structure 100 comprises a plurality of front side contact interface structures 110 for connecting the interposer structure 100 to at least one other structure. The plurality of front side contact interface structures 110 is located at a front side of an interposer substrate die 102 of the interposer structure 100. Additionally, the interposer structure 100 comprises a plurality of back side contact interface structures 120 for connecting the interposer structure 100 to at least one other structure. The plurality of back side contact interface structures 120 is located at a back side of the interposer substrate die 102 of the interposer structure 100. Further, the interposer structure 100 comprises a first through substrate via 130 extending from the front side of the interposer substrate die 102 of the interposer structure to the back side of the interposer substrate die 102 and an electrically conductive shielding structure 140 extending from the front side of the interposer substrate die 102 into the interposer substrate die 102. The electrically conductive shielding structure 140 ends before reaching the back side of the interposer substrate die 102 and the first through substrate via 130 is connected to the electrically conductive shielding structure 140 at the front side of the interposer substrate die 102.

By connecting the electrically conductive shielding structure to the first through substrate via, a reference potential (e.g. ground) applied to the first through substrate via can be applied to the electrically conductive shielding structure as well. In this way, a shielding structure can be implemented at a desired location on the interposer substrate die without the need for an additional contact interface to the electrically conductive shielding structure. In this way, the implementation of a large or arbitrary number of shielding structures on the interposer substrate die may be enabled without increasing the size of the interposer substrate die. Further, the implementation of shieling structures between neighboring signal lines may reduce the cross talk between the signal lines.

The electrically conductive shielding structure 140 may comprise electrically conductive material (e.g. copper) located in a trench extending from a first side of the interposer substrate die 102 towards a second side of the interposer substrate die 102. For example, the first side of the interposer substrate die 102 may be the front side of the interposer substrate die 102 and the second side of the interposer substrate die 102 may be the back side of the interposer substrate die 102. Consequently, the first through substrate via 130 may be connected to the electrically conductive shielding structure 140 at the front side of the interposer substrate die 102. Alternatively, the first side of the interposer substrate die 102 may be the back side of the interposer substrate die 102. An insulation layer may be located between tween the electrically conductive material of the electrically conductive shielding structure 140 and the substrate material (e.g. silicon or glass) of the interposer substrate die 102.

For example, the electrically conductive shielding structure 140 ends before reaching a second side of the interposer substrate die 102 so that the electrically conductive shielding structure 140 does not reach the second side and is not exposed at the second side. For example, the electrically conductive shielding structure 140 may end in a (vertical) distance to the second side of the interposer substrate die 102 of more than 5% (or more than 10%, more than 20% or more than 30%) of a thickness of the interposer substrate die. Further, the electrically conductive shielding structure 140 may end in a (vertical) distance to the first side of the interposer substrate die 102 or comprises a vertical extension of more than 30% (or more than 50%, more than 60% or more than 70%) of a thickness of the interposer substrate die 102. The shielding may be improved, if the electrically conductive shielding structure 140 reaches close to the second side. The electrically conductive shielding structure 140 may comprise a circular shape or a rectangular shape within the interposer substrate die 102 in a top view of the interposer substrate die 102. For example, the electrically conductive shielding structure 140 may comprise a maximal width or lateral dimension (e.g. within the interposer substrate die or measured at 50% of a thickness of the interposer substrate die) of less than 20 μm (or less than 15 μm or less than 10 μm) and/or a minimal width lateral dimension (e.g. within the interposer substrate die or measured at 50% of a thickness of the interposer substrate die) of more than 1 μm (or more than 2 μm or more than 5 μm). The width may be a lateral dimension in a side view of a cross-section of the interposer substrate. For example, the maximal lateral dimension may be a diameter of a circle, a length of a longer side of a rectangle or a length of a side of a square and the minimal lateral dimension may be a diameter of a circle, a length of a shorter side of a rectangle or a length of a side of a square depending on the shape of the electrically conductive shielding structure 140.

The first through substrate via 130 may be connected to the electrically conductive shielding structure 140 through a lateral wiring layer located at the first side of the interposer substrate die 102. For example, a wiring grid for distributing a reference potential (e.g. ground) may be located at the first side of the interposer substrate die 102. The wiring gird may be implemented within one or more lateral wiring layers of a wiring layer stack located on the interposer substrate die 102. The first through substrate via 130 may be connected to the electrically conductive shielding structure 140 through the reference potential wiring grid.

The first through substrate via 130 may comprise electrically conductive material (e.g. copper) located in a trench or hole extending through the whole interposer substrate die 102. An insulation layer may be located between the electrically conductive material of the first through substrate via 130 and the substrate material (e.g. silicon or glass) of the interposer substrate die 102. For example, the first through substrate via 130 may comprise a maximal width or lateral dimension (e.g. within the interposer substrate die or measured at 50% of a thickness of the interposer substrate die) of less than 30 μm (or less than 20 μm or less than 15 μm) and/or a minimal lateral dimension (e.g. within the interposer substrate die or measured at 50% of a thickness of the interposer substrate die) of more than 1 μm (or more than 2 μm or more than 5 μm). For example, the maximal lateral dimension may be a diameter of a circle, a length of a longer side of a rectangle or a length of a side of a square and the minimal lateral dimension may be a diameter of a circle, a length of a shorter side of a rectangle or a length of a side of a square depending on the shape of the first through substrate via 130. For example, the first through substrate via 130 may be connected to a back side contact interface structure 120 of the plurality of back side contact interface structures 120 at the back side of the interposer substrate die 102 and/or a front side contact interface structure 110 of the plurality of front side contact interface structures 110 at the front side of the interposer substrate die 102 in addition to the connection to the electrically conductive shielding structure 140.

For example, a maximal lateral dimension of the electrically conductive shielding structure 140 may be smaller than 90% (or smaller than 80% or smaller than 70%) of a maximal lateral dimension of the first through substrate via 130 (e.g. within the interposer substrate die or measured at 50% of a thickness of the interposer substrate die).

For example, the interposer structure 100 may comprise a plurality of electrically conductive shielding structures 140 extending from the first side of the interposer substrate die 102 into the interposer substrate die 102 and ending before reaching the second side of the interposer substrate die 102. Further, the interposer structure 100 may comprise a plurality of through substrate vias electrically insulated from each other (and electrically insulated from the first through substrate via and the plurality of electrically conductive shielding structures). For example, a total number of electrically conductive shielding structures 140 of the interposer structure 100 (e.g. extending into the interposer substrate die and connected to the first through substrate via) may be higher than 30% (or higher than 50% or higher than 70%) of a total number of through substrate vias of the interposer structure 100 (extending through the interposer substrate die).

The front side contact interface structures 110 of the plurality of front side contact interface structures 110 may be solder pads or solder bumps accessible at a front side surface of the interposer structure 100 so that at least one other structure can be connected (e.g. soldered) to the front side of the interposer structure 100. The front side contact interface structures 110 of the plurality of front side contact interface structures 110 may comprise or consist of electrically conductive material (e.g. copper). A pitch of neighboring front side contact interface structures of the plurality of front side contact interface structures may be smaller than a pitch of neighboring back side contact interface structures of the plurality of back side contact interface structures. The distance (pitch) between a center of a first front side contact interface structure 110 of the plurality of front side contact interface structures 110 and a center of a second, neighboring front side contact interface structure 110 of the plurality of front side contact interface structures 110 is smaller than 60 µm (or smaller than 50 µm or smaller than 40 µm). For example, the largest pitch between every two neighboring front side contact interface structures 110 of all front side contact interface structures 110 of the interposer structure 100 may be smaller than 60 µm (or smaller than 50 µm or smaller than 40 µm). A maximal lateral dimension of a front side contact interface structure (e.g. at least one or all) of the plurality of front side contact interface structures may be smaller than 35 µm (or smaller than 30 µm or smaller than 25 µm, for example, between 20 µm and 30 µm) and/or may be larger than 8 µm (or larger than 10 µm or larger than 15 µm). Neighboring contact interface structures may be two (or more, if equal spaced) contact interface structures located laterally closer to each other than any other contact interface structure, for example.

The back side contact interface structures 120 of the plurality of back side contact interface structures 120 may be solder pads or solder bumps accessible at a back side surface of the interposer structure 100 so that at least one other structure can be connected (e.g. soldered) to the back side of the interposer structure 100. The back side contact interface structures 120 of the plurality of back side contact interface structures 120 may comprise or consist of electrically conductive material (e.g. copper). The distance (pitch) between a center of a first back side contact interface structure 120 of the plurality of back side contact interface structures 120 and a center of a second, neighboring back side contact interface structure 120 of the plurality of back side contact interface structures 120 is larger than 80 µm (or larger than 90 µm or larger than 100 µm). For example, the smallest pitch between every two neighboring back side contact interface structures 120 of all back side contact interface structures 120 of the interposer structure 100 may be larger than 80 µm (or larger than 90 µm or larger than 100 µm). A maximal lateral dimension of a back side contact interface structure 120 (e.g. at least one or all) of the plurality of back side contact interface structures 120 may be larger than 40 µm (or larger than 45 µm or larger than 50 µm, for example, between 50 µm and 60 µm) and/or may be smaller than 90 µm (or smaller than 80 µm or smaller than 70 µm.

The interposer structure 100 may comprise a second through substrate via extending from the front side of the interposer substrate die 102 of the interposer structure 100 to the back side of the interposer substrate die 102. The second through substrate via may be electrically insulated from the first through substrate via 130 and the electrically conductive shielding structure 140. For example, the second through substrate via is connected to a front side contact interface structure 110 of the plurality of front side contact interface structures 110 and a back side contact interface structure 120 of the plurality of back side contact interface structures 120. For example, the second through substrate via can be used to provide a signal from a signal line of a carrier substrate connected to one or more back side contact interface structures 120 to a semiconductor component connected to one or more front side contact interface structures 110 or vice versa. The second through substrate via may be located laterally between the first through substrate via 130 and the electrically conductive shielding structure 140 within the interposer substrate die 102. In this way, a signal provided through the second through substrate via may be shielded by the first through substrate via 130 and the electrically conductive shielding structure 140.

Optionally, the interposer structure 100 may comprise a third through substrate via extending from the front side of the interposer substrate die 102 of the interposer structure 100 to the back side of the interposer substrate die 102. The third through substrate via may be connected to a front side contact interface structure 110 of the plurality of front side contact interface structures 110 and a back side contact interface structure 120 of the plurality of back side contact interface structures. The third through substrate via may be electrically insulated from the first through substrate via 130 and the electrically conductive shielding structure 140. For example, the third through substrate via can be used to provide another signal from another signal line of a carrier substrate connected to one or more back side contact interface structures 120 to a semiconductor component connected to one or more front side contact interface structures 110 or vice versa. For example, the electrically conductive shielding structure 140 may be located laterally between the second through substrate via and the third through substrate via. In this way, the electrically conductive shielding structure 140 may shield the second through substrate via from the third through substrate via.

For example, the interposer substrate die 102 may be a semiconductor die (e.g. silicon die) or a glass die. For example, a thickness of the interposer substrate die 102 may be smaller than 200 µm (or smaller than 150 µm or smaller than 100 µm). For example, the interposer substrate die 102 may be a silicon die and the through substrate via may be a through silicon via TSV.

For example, no transistors may be implemented on the interposer substrate die 102. In this way, the costs for manufacturing the interposer structure 100 may be very low. Implantations of dopants into the interposer substrate die 102 may be unnecessary, if no transistors and diodes are implemented on the on the interposer substrate die 102. Alternatively, the interposer structure 100 may be used to implement one or more transistors, diodes or coils at the interposer substrate die 102.

The front side of the interposer substrate die 102 may be a substrate surface (e.g. semiconductor surface) of the interposer substrate die 102. For example, wiring metal layers, insulation layers and/or passivation layers may be located on the front side of the interposer substrate die 102. In comparison to a basically vertical edge (e.g. resulting from separating the interposer substrate die from others) of the interposer substrate die, the front side of the interposer substrate die 102 may be a substantially horizontal surface extending laterally. The front side of the interposer substrate die 102 may be a substantially even plane (e.g. neglecting unevenness of the semiconductor structure due to the manufacturing process, trenches or through substrate vias).

For example, a lateral direction or lateral extension may be measured in parallel to the front side of the interposer substrate die 102 and a vertical direction or vertical extension may be measured orthogonal to the front side of the interposer substrate die 102.

A lateral wiring layer (e.g. metal layer of a layer stack on a substrate die) may be a layer for implementing lateral electrical connections between vertical electrical connections (vias) connecting lateral wiring layers. A vertical wiring layer (e.g. via layer of a layer stack on a substrate die) may be a layer for implementing vertical electrical connections (vias) between lateral wiring layers.

For example, the at least one other structure to be connected to one or more front side (or back side) contact interface structures of the plurality of front side contact interface structures may be a processor circuit (e.g. central processing unit CPU), a memory circuit, a (wireless or wireline) transmitter circuit and/or a (wireless or wireline) receiver circuit implemented on a semiconductor die.

For example, the at least one other structure to be connected to one or more back side (or front side) contact interface structures of the plurality of back side contact interface structures may be a carrier substrate (e.g. organic substrate).

Figure 2A:
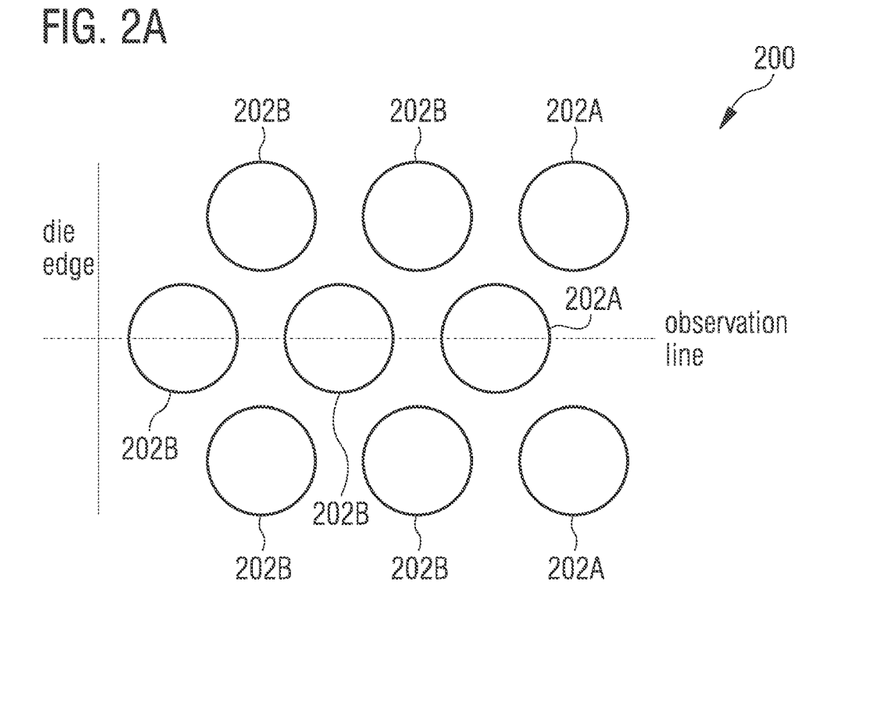
FIG. 2A shows a schematic top view of a bump field.

FIG. 2A shows a schematic top view of a part of a bump field according to an example. The bump field may be an example for back side contact interface structures 202A, 202B of a plurality of back side contact interface structures at a back side of an interposer structure 200. The interposer structure 200 may be implemented similar to the implementation of the interposer structure described in connection with FIG. 1. A first group of back side contact interface structures 202A may be used to be connected to a reference potential (e.g. ground). The first group of back side contact interface structures 202A are connected to a reference potential grid at the front side of the interposer structure 200 (see FIG. 2B). A second group of back side contact interface structures 202B may be electrically insulated from each other and the first group of back side contact interface structures 202A and may be used to provide signals from the back side of the interposer structure 200 to the front side of the interposer structure 200 or vice versa.

Alternatively or optionally, FIG. 2A may be an example of a bottom view of a bump field of a DDR (Double Data Rate memory) interface. The signal bumps are labeled 202B and the ground bumps are labeled 202A. For example, a typical four-row deep design with a 2:1 signal-to-ground ratio may be used.

Figure 2B:
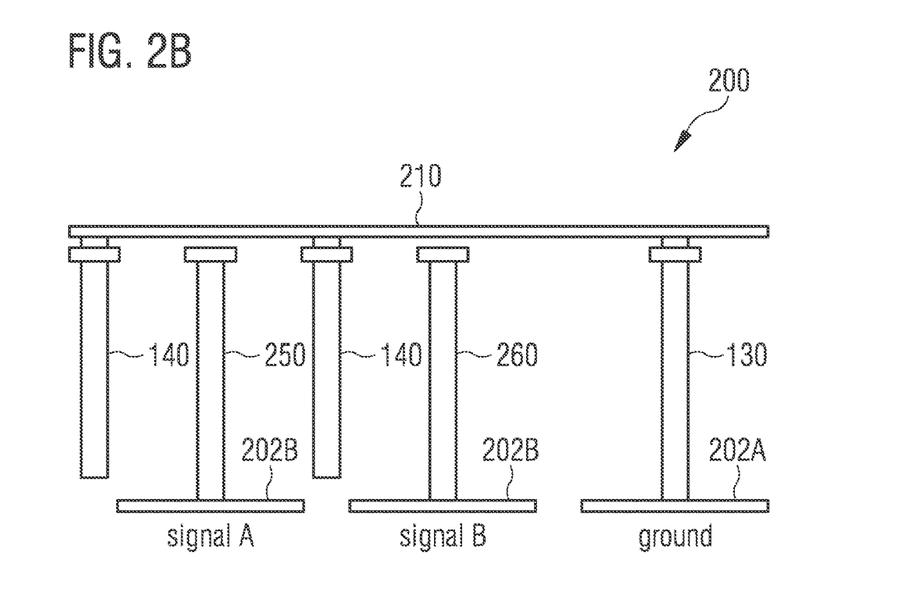
FIG. 2B shows a schematic cross section of through substrate vias of the interposer structure of FIG. 2A along the observation line indicated in FIG. 2A.

FIG. 2B shows a schematic cross section of through substrate vias of the interposer structure of FIG. 2A along the observation line indicated in FIG. 2A. The back side contact interface structures 202A of the first group are connected to the reference potential grid 210 at the front side of the interposer structure 200 through a first through substrate via 130 (e.g. through silicon via TSV). A first back side contact interface structure 202B of the second group is connected to a first front side contact interface structure (not shown) through a second through substrate via 250 for providing a first signal (signal A) and a second back side contact interface structure 202B of the second group is connected to a second front side contact interface structure (not shown) through a third through substrate via 260 for providing a second signal (signal B). The second through substrate via 250 is located laterally between two electrically conductive shielding structures 140 (e.g. blind ground through silicon vias TSV).

FIG. 2B may show an example for a side view of the TSVs and bumps with extra blind ground TSVs. The side view of the dashed observation line (of FIG. 2A) may be shown in FIG. 2B. The top portion may be the TSV landing on one of the back-end metal layers in the interposer structure. The top horizontal plane may represent the global meshed ground structure inside the interposer structure. All the ground TSVs may connect to it, while the signal TSVs may punch through it. The middle portion in FIG. 2B may be the TSV array. These vias may land on the bottom large bumps, which are connected to the organic substrate. The crosstalk between signals A and B may be significantly larger without blind TSVs. It may be reduced by inserting more ground bumps and TSVs between the signals, but it would increase the size of the bump field. Alternatively, the proposed concept inserts blind TSVs to shield signals shown in FIG. 2B. For example, two blind ground TSVs are inserted around the signal TSVs. They are grounded to the meshed ground structure on the top, and they are shorter than the normal TSVs to avoid shorting to signal bumps.

More details and aspects are mentioned in connection with the examples described above or below. The example shown in FIG. 2A and 2B may each comprise one or more optional additional features corresponding to one or more aspects mentioned in connection with the proposed concept or one or more examples described above (e.g. FIG. 1) or below (e.g. FIG. 3A-4).

Figure 3A:
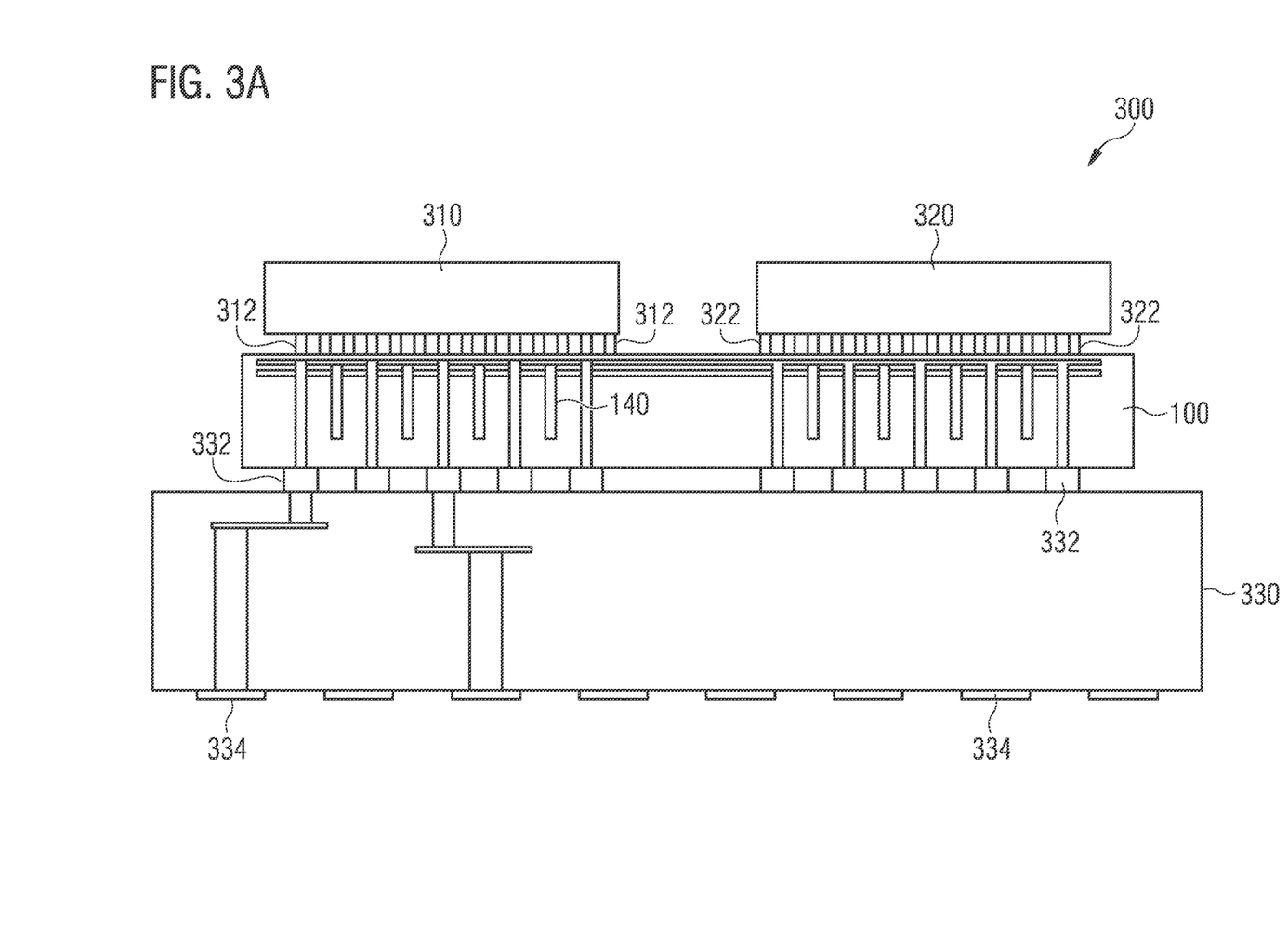
FIG. 3A shows a schematic cross section of a semiconductor device.

FIG. 3A shows a schematic cross section of a semiconductor assembly (or device) 300 according to an example. The semiconductor assembly 300 comprises an interposer structure 100 comprising a plurality of front side contact interface structures located at a front side of an interposer substrate die of the interposer structure. Further, the interposer structure 100 comprises a plurality of back side contact interface structures located at a back side of the interposer substrate die of the interposer structure. A first through substrate via 130 extends from the front side of the interposer substrate die of the interposer structure 100 to the back side of the interposer substrate die and an electrically conductive shielding structure 140 extends from the front side of an interposer substrate die into the interposer substrate die. The electrically conductive shielding structure ends before reaching the back side of the interposer substrate die and the first through substrate via is connected to the electrically conductive shielding structure at the front side of the interposer substrate die. Further, the semiconductor assembly 300 comprises a (first) semiconductor component 310 connected to at least one front side contact interface structure of the plurality of front side contact interface structures and a carrier substrate 330 connected to at least one back side contact interface structure of the plurality of back side contact interface structures at a front side of the carrier substrate 330.

The interposer structure 100 may be implemented similar to the implementation of the interposer structure described in connection with FIG. 1 or 2A.

The (first) semiconductor component 310 may be soldered to a first part of the plurality of front side contact interface structures forming solder connections 312 between the (first) semiconductor component 310 and the interposer structure 100 (e.g. controlled collapse chip connection C4).

Optionally, a second semiconductor component 320 may be connected to a second part of the plurality of front side contact interface structures of the interposer structure 100. The second semiconductor component 320 may be soldered to the second part of the plurality of front side contact interface structures forming solder connections 322 between the second semiconductor component 320 and the interposer structure 100 (e.g. controlled collapse chip connection C4).

For example, an area size of the interposer structure 100 may be larger than an area size of the (first) semiconductor component 310 and/or an area size of the second semiconductor component 320 or larger than a sum of the area size of the (first) semiconductor component 310 and area size of the second semiconductor component 320.

The carrier substrate 330 may be an organic substrate (e.g. package carrier substrate or printed circuit board PCB). The carrier substrate 330 may be soldered to (e.g. all back side contact interface structure of) the plurality of back side contact interface structures forming solder connections 332 between the carrier substrate 330 and the interposer structure 100. A plurality of back side contact interface structures of the carrier substrate 330 may be located at a back side of the carrier substrate 330 for connecting the semiconductor device 300 to an external structure (e.g. to a printed circuit board PCB), for example. One or more of the back side contact interface structures of the carrier substrate 330 may be connected to one or more of the back side contact interface structures of the interposer structure 100 by interconnections through the carrier substrate 330.

Figure 3B:
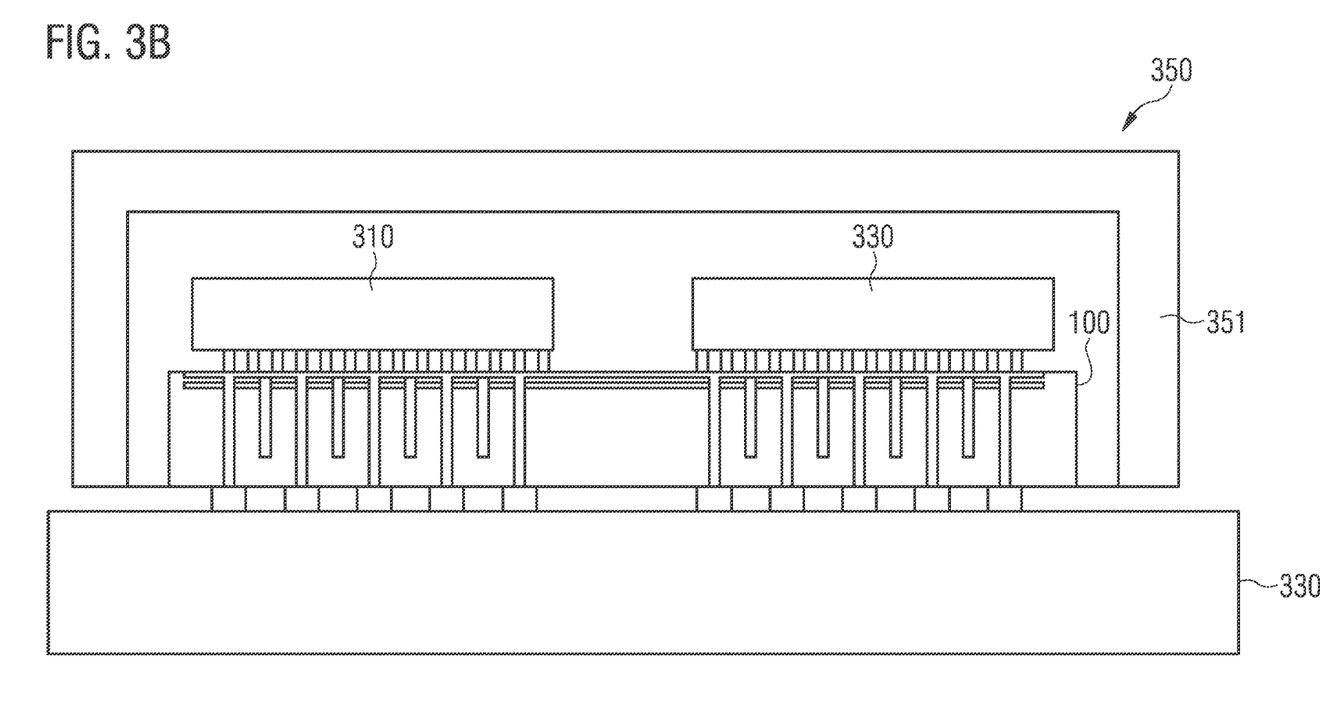
FIG. 3B shows a schematic cross section of a semiconductor package comprising the interposer substrate.

As shown in FIG. 3B, the interposer structure 100, the first semiconductor component 310, the second semiconductor component 320 and/or the carrier substrate 330 may be arranged in a common (mutual) semiconductor package 350. The carrier substrate 330 may be a package substrate of the common semiconductor package 350. The components of the electrical device may be embedded in the semiconductor package 350. For example, the first semiconductor component 310, the second semiconductor component 320 and/or the carrier substrate 330 may be partially or fully surrounded by a package material 351. The package material 351 may be an epoxy, a plastic and/or a mold compound, for example. Optionally, the carrier substrate may be a package substrate of the common semiconductor package 351.

More details and aspects are mentioned in connection with the examples described above or below. The examples shown in FIGS. 3A and 3B may each comprise one or more optional additional features corresponding to one or more aspects mentioned in connection with the proposed concept or one or more examples described above (e.g. FIG. 1-2B) or below (e.g. FIG. 4).

Figure 4:
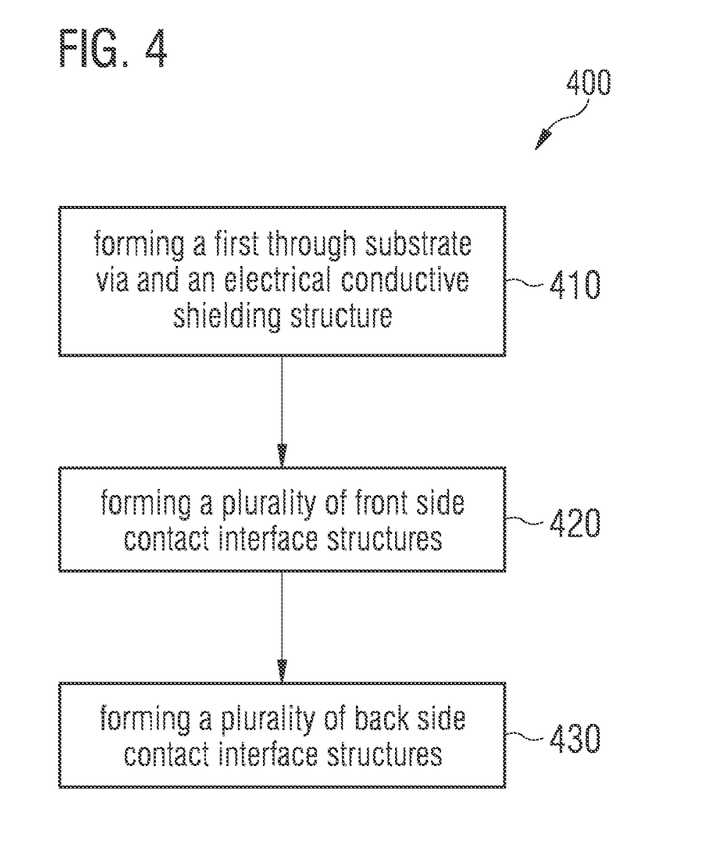
FIG. 4 shows a flow chart of a method for forming an interposer structure.

FIG. 4 shows a flow chart of a method for forming an interposer structure according to an example. The method 400 comprises forming 410 a first through substrate via and an electrically conductive shielding structure. The first through substrate via extends from a front side of an interposer substrate die of the interposer structure to a back side of the interposer substrate die and the electrically conductive shielding structure extends from the front side of an interposer substrate die into the interposer substrate die. Further, the electrically conductive shielding structure ends before reaching the back side of the interposer substrate die. Additionally, the method 400 comprises forming 420 a plurality of front side contact interface structures for connecting the interposer structure to at least one other structure at the front side of the interposer substrate die. Further, the method 400 comprises forming 430 a plurality of back side contact interface structures for connecting the interposer structure to at least one other structure at the back side of the interposer substrate die.

By connecting the electrically conductive shielding structure to the first through substrate via, a reference potential (e.g. ground) applied to the first through substrate via can be applied to the electrically conductive shielding structure as well. In this way, a shielding structure can be implemented at a desired location on the interposer substrate die without the need for an additional contact interface to the electrically conductive shielding structure.

For example, trenches for the first through substrate via and the electrically conductive shielding structure may be formed by a mutual etching process. For example, forming 410 the first through substrate via and the electrically conductive shielding structure may comprise simultaneously forming a first trench for the first through substrate via and a second trench for the electrically conductive shielding structure at the first side of the interposer substrate die. The first trench for the first through substrate via may extend from the front side of the interposer substrate die of the interposer structure to the back side of the interposer substrate die and the second trench may extend from the first side of the interposer substrate die into the interposer substrate die.

Further, the second trench may end before reaching the second side of the interposer substrate die although the first trench and the second trench may be etched simultaneously. For example, different depths of the first trench and the second trench may be obtained by selecting different lateral dimensions for the first trench and the second trench. For example, forming 410 the first through substrate via and the electrically conductive shielding structure may comprise forming a mask layer at the first side of the interposer substrate die. The mask layer may comprise a first opening for forming the first trench and a second opening for forming the second trench. For example, a maximal lateral dimension of the second opening may be smaller than 90% (or smaller than 80% or smaller than 70%) of a maximal lateral dimension of the first opening. Using different sizes of openings in the mask layer may result in a maximal lateral dimension of the second trench for the electrically conductive shielding structure being smaller than 90% (or smaller than 80% or smaller than 70%) of a maximal lateral dimension of the first trench for the first through substrate via (e.g. within the interposer substrate die or measured at 50% of a thickness of the interposer substrate die), for example.

The first side of the interposer substrate die may be the front side of the interposer substrate die and the second side of the interposer substrate die may be the back side of the interposer substrate die. Alternatively, the first side of the interposer substrate die may be the back side of the interposer substrate die.

For example, a pitch of neighboring front side contact interface structures of the plurality of front side contact interface structures is smaller than 60 µm and/or a pitch of neighboring back side contact interface structures of the plurality of back side contact interface structures is larger than 80 µm.

More details and aspects are mentioned in connection with the examples described above or below. The example shown in FIG. 4 may comprise one or more optional additional features corresponding to one or more aspects mentioned in connection with the proposed concept or one or more examples described above (e.g. FIG. 1-3B) or below.

Some examples relate to a method for forming a semiconductor device as described in connection with FIG. 3A and/or a semiconductor package as described in connection with FIG. 3B.

Some examples relate to blind TSV for signal shielding. The proposed concept may relate to blind through silicon via, crosstalk mitigation, ground shielding, signal integrity, through silicon via, design or L 1 interface or first level interconnect and/or bumpless build-up layer BBUL. The proposed concept may be implemented in high volume architectures as computer system architecture features & interfaces made in high volumes, may encompass IA (integrated architectures), devices (e.g. transistors) and associated manufacturing (mfg) processes, for example. The proposed concept may be implemented in high volume architectures as computer system architecture features & interfaces made in high volumes, may encompass IA (integrated architectures), devices (e.g. transistors) and associated manufacturing (mfg) processes, for example.

For example, interposer technology interposes a low cost silicon between an advanced silicon and an organic substrate (e.g. FIG. 3). The middle low cost silicon may be bonded to the advanced silicon face to face on the top side with a very fine pitch, and may use through silicon vias (TSVs) to connect to the C4 bumps on the bottom side with a much coarser pitch. These TSVs may be 100 μm in height. They may cause additional crosstalk between signals and degrade the I/O signaling performance, for example, for single-ended I/O system like DDR memory interface, which may be mitigated by adding grounded blind TSVs.

Ground shielding may be an effective way to mitigate crosstalk between signals. Since the TSV pitch can be much finer than the C4 bump pitch, extra grounded blind TSVs may be inserted between signal TSVs without increasing the number of bumps. In comparision, the crosstalk can be mitigated by adding more ground bumps to lower the signal-to-ground ratio. But it leads to larger bump field and silicon area. Based on the proposed concept, TSV crosstalk may be mitigated without changing the bump field.

Blind TSVs may be implemented by controlling the etching process. The general shielding concept may be applied to package, socket and board with positive impact.

The proposed concept may be used for CPU/processors, Chipsets, graphical devices, wireless devices, multi-chip/3D packaging including CPU in combo with other devices, memory (e.g. Flash, DRAM or SRAM) and/or boards (e.g. motherboards).

In the following examples pertain to further examples. Example 1 is an interposer structure comprising a plurality of front side contact interface structures for connecting the interposer structure to at least one other structure, wherein the plurality of front side contact interface structures is located at a front side of an interposer substrate die of the interposer structure; a plurality of back side contact interface structures for connecting the interposer structure to at least one other structure, wherein the plurality of back side contact interface structures is located at a back side of the interposer substrate die of the interposer structure; a first through substrate via extending from the front side of the interposer substrate die of the interposer structure to the back side of the interposer substrate die; and an electrically conductive shielding structure extending from the front side of the interposer substrate die into the interposer substrate die, wherein the electrically conductive shielding structure ends before reaching the back side of the interposer substrate die, wherein the first through substrate via is connected to the electrically conductive shielding structure at the front side of the interposer substrate die.

In example 2, the subject matter of example 1 can optionally include a pitch of neighboring front side contact interface structures of the plurality of front side contact interface structures being smaller than a pitch of neighboring back side contact interface structures of the plurality of back side contact interface structures.

In example 3, the subject matter of example 2 can optionally include the pitch of neighboring front side contact interface structures of the plurality of front side contact interface structures being smaller than 60 μm.

In example 4, the subject matter of example 2 or 3 can optionally include the pitch of neighboring back side contact interface structures of the plurality of back side contact interface structures being larger than 80 μm.

In example 5, the subject matter of any of examples 1 to 4 can optionally include a second through substrate via extending from the front side of the interposer substrate die of the interposer structure to the back side of the interposer substrate die, wherein the second through substrate via is connected to a front side contact interface structure of the plurality of front side contact interface structures and a back side contact interface structure of the plurality of back side contact interface structures, wherein the second through substrate via is electrically insulated from the first through substrate via.

In example 6, the subject matter of example 5 can optionally include the second through substrate via being located between the first through substrate via and the electrically conductive shielding structure.

In example 7, the subject matter of example 5 or 6 can optionally include a third through substrate via extending from the front side of the interposer substrate die of the interposer structure to the back side of the interposer substrate die, wherein the third through substrate via is connected to a front side contact interface structure of the plurality of front side contact interface structures and a back side contact interface structure of the plurality of back side contact interface structures, wherein the third through substrate via is electrically insulated from the first through substrate via.

In example 8, the subject matter of example 7 can optionally include the electrically conductive shielding structure being located between the second through substrate via and the third through substrate via.

In example 9, the subject matter of any of examples 1 to 8 can optionally include the first through substrate via being connected to a back side contact interface structure of the plurality of back side contact interface structures at the back side of the interposer substrate die.

In example 10, the subject matter of any of examples 1 to 9 can optionally include the first through substrate via being connected to the electrically conductive shielding structure through a reference potential wiring grid located at the front side of the interposer substrate die.

In example 11, the subject matter of any of examples 1 to 10 can optionally include the electrically conductive shielding structure ending in a distance to the back side of the interposer substrate die of more than 5% of a thickness of the interposer substrate die.

In example 12, the subject matter of any of examples 1 to 11 can optionally include a maximal width of the electrically conductive shielding structure being smaller than 90% of a maximal width of the first through substrate via.

In example 13, the subject matter of any of examples 1 to 12 can optionally include a maximal width of a front side contact interface structure of the plurality of front side contact interface structures being smaller than 35 μm.

In example 14, the subject matter of any of examples 1 to 13 can optionally include a maximal width of a back side contact interface structure of the plurality of back side contact interface structures being larger than 55 μm.

In example 15, the subject matter of any of examples 1 to 14 can optionally include a thickness of the interposer substrate die being smaller than 200 μm.

In example 16, the subject matter of any of examples 1 to 15 can optionally include the interposer substrate die is a semiconductor die.

In example 17, the subject matter of any of examples 1 to 16 can optionally include no transistor being implemented on the interposer substrate die.

In example 18, the subject matter of any of examples 1 to 17 can optionally include the first through substrate via and the electrically conductive shielding structure comprising copper.

In example 19, the subject matter of any of examples 1 to 18 can optionally include the plurality of front side contact interface structures and the plurality of back side contact interface structures being solder bumps or solder pads.

In example 20, the subject matter of any of examples 1 to 19 can optionally include a plurality of electrically conductive shielding structures extending from the front side of the interposer substrate die into the interposer substrate die and ending before reaching the back side of the interposer substrate die, wherein the interposer structure comprises a plurality of through substrate vias electrically insulated from each other, wherein a total number of electrically conductive shielding structures of the interposer structure is higher than 30% of a total number of through substrate vias of the interposer structure.

Example 21 is a semiconductor assembly comprising an interposer structure comprising a plurality of front side contact interface structures located at a front side of an interposer substrate die of the interposer structure, wherein the interposer structure comprises a plurality of back side contact interface structures located at a back side of the interposer substrate die of the interposer structure, wherein a first through substrate via extends from the front side of the interposer substrate die of the interposer structure to the back side of the interposer substrate die, wherein an electrically conductive shielding structure extends from the front side of an interposer substrate die into the interposer substrate die, wherein the electrically conductive shielding structure ends before reaching the back side of the interposer substrate die, wherein the first through substrate via is connected to the electrically conductive shielding structure at the front side of the interposer substrate die; a semiconductor component connected to at least one front side contact interface structure of the plurality of front side contact interface structures; and a carrier substrate connected to at least one back side contact interface structure of the plurality of back side contact interface structures at a front side of the carrier substrate.

In example 22, the subject matter of example 21 can optionally include the interposer structure, the semiconductor component and the carrier substrate being arranged in a common semiconductor package.

In example 23, the subject matter of example 21 or 22 can optionally include a second semiconductor component is connected to at least one front side contact interface structure of the plurality of front side contact interface structures.

In example 24, the subject matter of any of examples 21 to 23 can optionally include the carrier substrate comprising a plurality of back side contact interface structures at a back side of the carrier substrate.

Example 25 is a method for forming an interposer structure, wherein the method comprises forming a first through substrate via and an electrically conductive shielding structure, wherein the first through substrate via extends from a front side of an interposer substrate die of the interposer structure to a back side of the interposer substrate die, wherein the electrically conductive shielding structure extends from the front side of an interposer substrate die into the interposer substrate die, wherein the electrically conductive shielding structure ends before reaching the back side of the interposer substrate die; forming a plurality of front side contact interface structures for connecting the interposer structure to at least one other structure at the front side of the interposer substrate die; and forming a plurality of back side contact interface structures for connecting the interposer structure to at least one other structure at the back side of the interposer substrate die.

In example 26, the subject matter of example 25 can optionally include forming the first through substrate via and the electrically conductive shielding structure comprising simultaneously forming a first trench for the first through substrate via and a second trench for the electrically conductive shielding structure at the front side of the interposer substrate die, wherein the first trench for the first through substrate via extends from the front side of the interposer substrate die of the interposer structure to the back side of the interposer substrate die, wherein the second trench extends from the front side of the interposer substrate die into the interposer substrate die, wherein the trench of the electrically conductive shielding structure ends before reaching the back side of the interposer substrate die.

In example 27, the subject matter of example 26 can optionally include forming the first through substrate via and the electrically conductive shielding structure comprising forming a mask layer at the front side of the interposer substrate die, wherein the mask layer comprises a first opening for forming the first trench and a second opening for forming the second trench, wherein a maximal width of the second opening is smaller than 90% of a maximal width of the first opening.

In example 28, the subject matter of any of examples 25 to 27 can optionally include a pitch of neighboring front side contact interface structures of the plurality of front side contact interface structures being smaller than 60 µm.

In example 29, the subject matter of any of examples 25 to 28 can optionally include a pitch of neighboring back side contact interface structures of the plurality of back side contact interface structures being larger than 80 µm.

In example 30, the subject matter of any of examples 25 to 29 can optionally include forming the first through substrate via and the electrically conductive shielding structure comprising forming a second through substrate via extending from the front side of the interposer substrate die of the interposer structure to the back side of the interposer substrate die, wherein the second through substrate via is connected to a front side contact interface structure of the plurality of front side contact interface structures and a back side contact interface structure of the plurality of back side contact interface structures, wherein the second through substrate via is electrically insulated from the first through substrate via.

In example 31, the subject matter of example 30 can optionally include the second through substrate via being located between the first through substrate via and the electrically conductive shielding structure.

In example 32, the subject matter of example 30 or 31 can optionally include forming the first through substrate via and the electrically conductive shielding structure comprising forming a third through substrate via extending from the front side of the interposer substrate die of the interposer structure to the back side of the interposer substrate die, wherein the third through substrate via is connected to a front side contact interface structure of the plurality of front side contact interface structures and a back side contact interface structure of the plurality of back side contact interface structures, wherein the third through substrate via is electrically insulated from the first through substrate via.

In example 33, the subject matter of example 32 can optionally include the electrically conductive shielding structure being located between the second through substrate via and the third through substrate via.

Example 34 is a machine readable storage medium including program code, when executed, to cause a machine to perform the method of any of examples 25 to 33.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that-although a dependent claim may refer in the claims to a specific combination with one or more other claims-other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for forming an interposer structure, wherein the method comprises:
    forming a first through substrate via and an electrically conductive shielding structure, wherein the first through substrate via extends from a front side of an interposer substrate die of the interposer structure to a back side of the interposer substrate die, wherein the electrically conductive shielding structure extends from the front side of an interposer substrate die into the interposer substrate die, wherein the electrically conductive shielding structure ends before reaching the back side of the interposer substrate die;
    forming a second through substrate via, wherein the second through substrate via extends from the front side of the interposer substrate die of the interposer structure to the back side of the interposer substrate die, wherein the second through substrate via is located between the first through substrate via and the electrically conductive shielding structure;
    forming a plurality of front side contact interface structures for connecting the interposer structure to at least one other structure at the front side of the interposer substrate die; and
    forming a plurality of back side contact interface structures for connecting the interposer structure to at least one other structure at the back side of the interposer substrate die.

2. The method according to claim 1, wherein forming the first through substrate via and the electrically conductive shielding structure comprises simultaneously forming a first trench for the first through substrate via and a second trench for the electrically conductive shielding structure at the front side of the interposer substrate die, wherein the first trench for the first through substrate via extends from the front side of the interposer substrate die of the interposer structure to the back side of the interposer substrate die, wherein the second trench extends from the front side of the interposer substrate die into the interposer substrate die, wherein the trench of the electrically conductive shielding structure ends before reaching the back side of the interposer substrate die.

3. A semiconductor assembly comprising:
    an interposer structure comprising a plurality of front side contact interface structures located at a front side of an interposer substrate die of the interposer structure, wherein the interposer structure comprises a plurality of back side contact interface structures located at a back side of the interposer substrate die of the interposer structure,
    wherein a first through substrate via extends from the front side of the interposer substrate die of the interposer structure to the back side of the interposer substrate die, wherein an electrically conductive shielding structure extends from the front side of an interposer substrate die into the interposer substrate die, wherein the electrically conductive shielding structure ends before reaching the back side of the interposer substrate die, wherein the first through substrate via is connected to the electrically conductive shielding structure at the front side of the interposer substrate die,
    wherein a second through substrate via extends from the front side of the interposer substrate die of the interposer structure to the back side of the interposer substrate die, wherein the second through substrate via is connected to a front side contact interface structure of the plurality of front side contact interface structures and a back side contact interface structure of the plurality of back side contact interface structures, wherein the second through substrate via is electrically insulated from the first through substrate via,
    wherein the second through substrate via is located between the first through substrate via and the electrically conductive shielding structure;

a semiconductor component connected to at least one front side contact interface structure of the plurality of front side contact interface structures; and a carrier substrate connected to at least one back side contact interface structure of the plurality of back side contact interface structures at a front side of the carrier substrate.

4. The semiconductor assembly according to claim 3, wherein a second semiconductor component is connected to at least one front side contact interface structure of the plurality of front side contact interface structures.

5. The semiconductor assembly according to claim 3, wherein the interposer structure, the semiconductor component and the carrier substrate are arranged in a common semiconductor package.

6. An interposer structure comprising:
a plurality of front side contact interface structures for connecting the interposer structure to at least one other structure, wherein the plurality of front side contact interface structures is located at a front side of an interposer substrate die of the interposer structure;
a plurality of back side contact interface structures for connecting the interposer structure to at least one other structure, wherein the plurality of back side contact interface structures is located at a back side of the interposer substrate die of the interposer structure;
a first through substrate via extending from the front side of the interposer substrate die of the interposer structure to the back side of the interposer substrate die;
an electrically conductive shielding structure extending from the front side of the interposer substrate die into the interposer substrate die, wherein the electrically conductive shielding structure ends before reaching the back side of the interposer substrate die, wherein the first through substrate via is connected to the electrically conductive shielding structure at the front side of the interposer substrate die; and
a second through substrate via extending from the front side of the interposer substrate die of the interposer structure to the back side of the interposer substrate die, wherein the second through substrate via is connected to a front side contact interface structure of the plurality of front side contact interface structures and a back side contact interface structure of the plurality of back side contact interface structures, wherein the second through substrate via is electrically insulated from the first through substrate via,
wherein the second through substrate via is located between the first through substrate via and the electrically conductive shielding structure.

7. The interposer structure according to claim 6, comprising a plurality of electrically conductive shielding structures extending from the front side of the interposer substrate die into the interposer substrate die and ending before reaching the back side of the interposer substrate die, wherein the interposer structure comprises a plurality of through substrate vias electrically insulated from each other, wherein a total number of electrically conductive shielding structures of the interposer structure is higher than 30% of a total number of through substrate vias of the interposer structure.

8. The interposer structure according to claim 6, wherein the first through substrate via is connected to the electrically conductive shielding structure through a reference potential wiring grid located at the front side of the interposer substrate die.

9. The interposer structure according to claim 6, wherein the first through substrate via is connected to a back side contact interface structure of the plurality of back side contact interface structures at the back side of the interposer substrate die.

10. The interposer structure according to claim 6, wherein the electrically conductive shielding structure ends in a distance to the back side of the interposer substrate die of more than 5% of a thickness of the interposer substrate die.

11. The interposer structure according to claim 6, wherein the plurality of front side contact interface structures and the plurality of back side contact interface structures are solder bumps or solder pads.

12. The interposer structure according to claim 6, wherein a maximal width of the electrically conductive shielding structure is smaller than 90% of a maximal width of the first through substrate via.

13. The interposer structure according to claim 6, wherein a maximal width of a front side contact interface structure of the plurality of front side contact interface structures is smaller than 35 um.

14. The interposer structure according to claim 1, wherein a maximal width of a back side contact interface structure of the plurality of back side contact interface structures is larger than 55 u m.

15. The interposer structure according to claim 6, wherein the first through substrate via and the electrically conductive shielding structure comprise copper.

16. The interposer structure according to claim 6, wherein a thickness of the interposer substrate die is smaller than 200 um.

17. The interposer structure according to claim 6, wherein no transistor is implemented on the interposer substrate die.

18. The interposer structure according to claim 6, wherein the interposer substrate die is a semiconductor die.

19. The interposer structure according to claim 6, further comprising a third through substrate via extending from the front side of the interposer substrate die of the interposer structure to the back side of the interposer substrate die, wherein the third through substrate via is connected to a front side contact interface structure of the plurality of front side contact interface structures and a back side contact interface structure of the plurality of back side contact interface structures, wherein the third through substrate via is electrically insulated from the first through substrate via.

20. The interposer structure according to claim 19, wherein the electrically conductive shielding structure is located between the second through substrate via and the third through substrate via.

21. The interposer structure according to claim 6, wherein a pitch of neighboring front side contact interface structures of the plurality of front side contact interface structures is smaller than a pitch of neighboring back side contact interface structures of the plurality of back side contact interface structures.

22. The interposer structure according to claim 21, wherein the pitch of neighboring front side contact interface structures of the plurality of front side contact interface structures is smaller than 60 pm.

23. The interposer structure according to claim 21, wherein the pitch of neighboring back side contact interface structures of the plurality of back side contact interface structures is larger than 80 um.

* * * * *